(12) United States Patent
Oh et al.

(10) Patent No.: US 8,697,583 B2
(45) Date of Patent: Apr. 15, 2014

(54) OXIDATION-PROMOTING COMPOSITIONS, METHODS OF FORMING OXIDE LAYERS, AND METHODS OF FABRICATING SEMICONDUCTOR DEVICES

(75) Inventors: Kyung-seok Oh, Seoul (KR);
Kyung-mun Byun, Seoul (KR);
Shin-hye Kim, Suwon-si (KR);
Deok-young Jung, Seoul (KR);
Gil-heyun Choi, Seoul (KR); Eunkee Hong, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 333 days.

(21) Appl. No.: 13/224,737

(22) Filed: Sep. 2, 2011

(65) Prior Publication Data
US 2012/0058647 A1    Mar. 8, 2012

(30) Foreign Application Priority Data
Sep. 2, 2010    (KR) .................. 10-2010-0086174

(51) Int. Cl.
*H01L 21/31*    (2006.01)
*H01L 21/469*    (2006.01)

(52) U.S. Cl.
USPC ........... 438/771; 438/781; 438/782; 438/785; 438/787; 257/E21.282; 257/E21.429; 257/E21.481

(58) Field of Classification Search
USPC .................. 438/694, 771–785; 257/E21.263, 257/E21.282, E21.479
See application file for complete search history.

(56) References Cited

FOREIGN PATENT DOCUMENTS

| JP | 2003-229422 | | 8/2003 |
|---|---|---|---|
| JP | 2005045230 A | * | 2/2005 |
| KR | 1020040091978 A | | 3/2004 |
| KR | 1020070019748 A | | 2/2007 |
| KR | 1020090044497 A | | 5/2009 |

* cited by examiner

*Primary Examiner* — Charles Garber
*Assistant Examiner* — Abdulfattah Mustapha
(74) *Attorney, Agent, or Firm* — Myers Bigel Sibley & Sajovec, P.A.

(57) ABSTRACT

Provided according to embodiments of the present invention are an oxidation-promoting compositions, methods of forming oxide layers, and methods of fabricating semiconductor devices. In some embodiments of the invention, the oxidation-promoting composition includes an oxidation-promoting agent having a structure of A-M-L, wherein L is a functional group that is chemisorbed to a surface of silicon, silicon oxide, silicon nitride, or metal, A is a thermally decomposable oxidizing functional group, and M is a moiety that allows A and L to be covalently bonded to each other.

20 Claims, 9 Drawing Sheets

OXIDATION-PROMOTING COMPOSITIONS, METHODS OF FORMING OXIDE LAYERS, AND METHODS OF FABRICATING SEMICONDUCTOR DEVICES

CROSS-REFERENCE TO RELATED APPLICATIONS

This application claims the benefit of Korean Patent Application No. 10-2010-0086174, filed on Sep. 2, 2010, in the Korean Intellectual Property Office, the disclosure of which is incorporated by reference herein in its entirety.

BACKGROUND

The present invention relates to oxidation-promoting compositions, methods of forming oxide layers, and methods of fabricating semiconductor devices.

In semiconductor device fabrication, silicon oxide layer formation is an important process. The decrease in size of semiconductor devices has resulted in the demand for high-quality silicon oxide layers. However, high temperature processes have conventionally been used to form high-quality silicon oxide layers, and such high temperature processes may undesirably affect other device characteristics.

SUMMARY

Provided according to embodiments of the present invention are methods of forming oxide layers. In some embodiments, such methods include forming an oxidation-promoting agent layer on a surface of a semiconductor substrate; forming a spin-on-glass (SOG) material layer on the oxidation-promoting agent layer; soft-baking the SOG material layer; and annealing the oxidation-promoting agent layer and the SOG material layer, to form the oxide layer. In some embodiments, annealing is performed in an oxidizing atmosphere.

In some embodiments, forming the oxidation-promoting agent layer includes forming a monolayer including an oxidation-promoting agent. In some embodiments, forming the monolayer includes applying an oxidation-promoting composition to the surface of the semiconductor substrate, wherein the oxidation-promoting composition includes an oxidation-promoting agent represented by Formula 1

$$A\text{-}M\text{-}L \qquad (1)$$

wherein L is a functional group that is capable of being chemisorbed to a surface of silicon, silicon oxide, silicon nitride or a metal; A is an oxidizing functional group, and M is a thermally decomposable moiety that allows A and L to be covalently linked.

In some embodiments of the invention, the oxidation-promoting composition further includes a solvent. In some embodiments, the oxidation-promoting agent is present in the oxidation-promoting composition at a concentration in a range of $1\times10^{-6}$ M to $1\times10^{-2}$ M.

Also provided are oxide layers and semiconductor devices formed by a method described herein.

BRIEF DESCRIPTION OF THE DRAWINGS

Exemplary embodiments of the inventive concept will be more clearly understood from the following detailed description taken in conjunction with the accompanying drawings in which:

FIGS. 1A to 4 are cross-sectional views illustrating a method of forming a silicon oxide layer according to some embodiments of the present invention.

DETAILED DESCRIPTION OF THE EMBODIMENTS

Reference will now be made in detail to particular embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description. Like numbers refer to like elements throughout. Furthermore, various elements and regions in the drawings are schematically illustrated. Accordingly, the present invention is not limited by relative sizes and spacings illustrated in the attached drawings.

It will be understood that although the terms 'first' and 'second' are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "comprises," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Provided according to some embodiments of the invention are oxidation-promoting compositions. Such oxidation-promoting composition may be used in forming, for example, a silicon oxide layer in a semiconductor device fabrication process. The oxidation-promoting composition includes an oxidation-promoting agent, and in some embodiments, a solvent. The solvent may be used to dissolve the oxidation-promoting agent.

In some embodiments of the invention, the oxidation-promoting agent is present in the oxidation-promoting composition at a concentration in a range of $1\times10^{-6}$ M to $1\times10^{-2}$ M. In particular embodiments of the invention, the oxidation-promoting agent is present in the oxidation-promoting composition at a concentration in a range of $1\times10^{-4}$ M to $5\times10^{-3}$ M. Furthermore, in particular embodiments, the oxidation-promoting agent is present in the oxidation-promoting composition at a concentration in a range of $8\times10^{-4}$ M to $3\times10^{-3}$ M.

According to some embodiments of the invention, the oxidation-promoting agent has the structure of Formula 1:

A-M-L     (1)

In Formula 1, A is an oxidizing functional group. Any suitable oxidizing functional group may be used. However, examples of oxidizing functional groups include an amine group that is unsubstituted or substituted with an alkyl (e.g., $C_1$ to $C_3$ alkyl group), an alkoxy (e.g., a $C_1$ to $C_3$ alkoxy group), a halogen atom or an aryl (e.g., a $C_6$ to $C_8$ aryl group); an ammonium ion ($—NH_3^+$); and a pyridinyl group ($—C_5NH_4$). Combinations of oxidizing functional groups may also be used.

In Formula 1, L is a functional group that may be chemisorbed to a silicon substrate, such as silicon, silicon oxide, silicon nitride, or a metal. Any suitable functional group may be used for L. However, examples of L groups include a halogen atom; an alkoxy group (e.g., a $C_1$ to $C_5$ alkoxy group); a silyl group that is unsubstituted or substituted with a halogen atom or an alkoxy group (e.g., a $C_1$ to $C_5$ alkoxy group); a silyloxy group that is unsubstituted or substituted with a halogen atom or an alkoxy group (e.g., a $C_1$ to $C_5$ alkoxy group); a hydroxyl group; an alkyl group (e.g., a $C_1$ to $C_5$ alkyl group); an alkenyl group (e.g., a $C_2$ to $C_5$ alkenyl group); an alkynyl group (e.g., a $C_2$ to $C_5$ alkynyl group); and a diester group such as that represented by $R^2COO—OOCR^3$, wherein $R^2$ and $R^3$ are each independently an A-M-moiety of Formula 1. Combinations of L functional groups may also be used.

The oxidation-promoting agent may be chemisorbed to any suitable chemical moiety on the semiconductor substrate. However, in some cases, the surface to which the oxidation-promoting agent is chemisorbed is a silicon surface terminated with —OH or a silicon oxide surface terminated with —OH. In such cases, in some embodiments, L is a halogen atom; an alkoxy group; or a silyl group that is unsubstituted or substituted with a halogen atom or an alkoxy group.

In some embodiments, the surface to which the oxidation-promoting agent is chemisorbed is a silicon or silicon nitride surface terminated with —H. In such cases, in some embodiments, L is a hydroxyl group; an alkyl group; an alkenyl group; a $C_2$ to $C_5$ alkynyl group; or a diester group represented by $R^2COO—OOCR^3$, wherein $R^2$ and $R^3$ are each independently an A-M-moiety of Formula 1.

In some embodiments, the surface to which the oxidation-promoting agent is chemisorbed is a metal surface. In such cases, in some embodiments, L is a halogen atom; an alkoxy group; a silyl group that is unsubstituted or substituted with a halogen atom or an alkoxy group; a hydroxyl group; an alkyl group; an alkenyl group; an alkynyl group; or a diester group such as that represented by $R^2COO—OOCR^3$, wherein $R^2$ and $R^3$ are each independently an A-M-moiety of Formula 1. Alternatively, L may be, for example, $—SiCl_3$, $—SiOR^1_3$, or $—OSiCl_3$, wherein $R^1$ may be an alkyl group (e.g., a $C_1$ to $C_4$ alkyl group), or an alkenyl group (e.g., a $C_2$ to $C_4$ alkenyl group).

It is noted that chemisorption is distinguishable from physisorption. L forms an electronic bond, such as an ionic bond or a covalent bond with the surface of the semiconductor substrate, thereby forming relatively strong adsorption.

In Formula 1, M may be a thermally decomposable moiety that allows A and L to be covalently bonded to each other. In some cases, M is thermally decomposable within a particular temperature range. For example, in some embodiments, M is a $C_2$ to $C_{18}$ hydrocarbon. In some such cases, the thermal decomposition temperature of M may be in a range of about 50° C. to about 1100° C. In particular cases, the thermal decomposition temperature of M may be in a range of about 50° C. to about 600° C.

Any suitable thermally decomposable moiety may be used for M. However, in some embodiments, M includes a hydrazine moiety (—N═N—). If M includes a hydrazine moiety, the thermal decomposition temperature may be in a range of about 50° C. to about 250° C. In some embodiments, M includes a peroxide moiety (—O—O—). If M includes a peroxide moiety, the thermal decomposition temperature may be in a range of about 50° C. to about 180° C. In some embodiments, M includes a disulfide moiety (—S—S—). If M includes a disulfide moiety, the thermal decomposition temperature may be in a range of about 50° C. to about 300° C. In some cases, combinations of thermally decomposable moieties may be used for M.

As described above, in some embodiments of the invention, the oxidation-promoting composition may include a solvent. Any suitable solvent may be used. However, in some cases, the solvent dissolves the oxidation-promoting agent. Furthermore, in some embodiments, the solvent includes a non-polar solvent. Examples of solvents include a $C_6$ to $C_{12}$ aromatic solvent, such as benzene, toluene, or xylene; an ether-based solvent, such as dialkylether that includes, as an alkyl group, at least one selected from the group consisting of methyl, ethyl, propyl, butyl, and pentyl group; a $C_7$ to $C_{20}$ alkane-based solvent; and a $C_6$ to $C_{20}$ cycloalkane solvent.

Methods of using the oxidation-promoting composition according to some embodiments of the invention will now be described in detail. In some cases, the oxidation-promoting agent may form a monolayer on the semiconductor substrate. In this regard, the L moiety of the compound of Formula 1 may be chemisorbed to the semiconductor substrate. A spin-on-glass (SOG) material layer may then be formed on the oxidation-promoting agent monolayer, and then when the SOG material layer is soft-baked, the M moiety may be thermally decomposed and the A moiety in the compound of Formula 1 may diffuse into the SOG material layer.

When the SOG material layer is annealed in an oxidizing atmosphere, the surface of the SOG material layer that is exposed to the oxidizing atmosphere may be oxidized due to a direct contact with the oxidizing atmosphere, and thus, a silicon oxide may be formed. Additionally, the surface of the SOG material layer that is adjacent to the semiconductor substrate may be enriched with the A moiety that becomes separated from the oxidation-promoting agent of Formula 1 and may diffuse into the SOG material layer. Thus, the A moiety may contribute to the oxidation of the SOG material layer, and a high quality silicon oxide may be formed in the portion of the SOG material layer that is adjacent to the semiconductor substrate.

Another embodiment of the present invention provides a method of forming an oxide layer, in particular, a silicon oxide layer. It is to be understood that the same process may be used with other oxide forming layers. FIGS. 1A to 4 are cross-sectional views used to illustrate a method of forming a silicon oxide layer according to some embodiments of the invention.

Figure 1A:
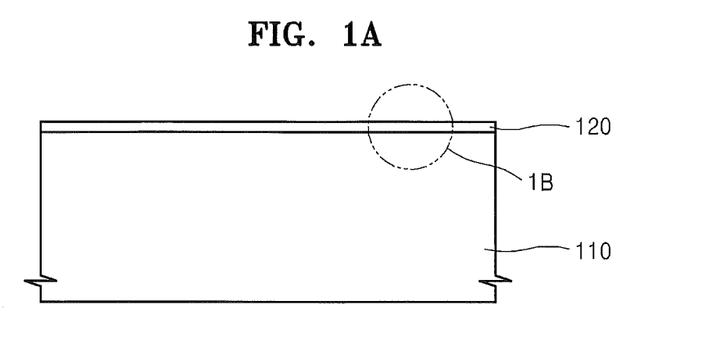

Referring to FIG. 1A, an oxidation-promoting agent layer 120 may be formed on the semiconductor substrate 110. To form the oxidation-promoting agent layer 120 on the semiconductor substrate 110, an oxidation-promoting composition including an oxidation-promoting agent may be applied to the semiconductor substrate 110. The applying of the oxidation-promoting agent to the semiconductor substrate 110 may be performed by, for example, spin coating or dip coating. However, any suitable application method may be used.

In some embodiments, the oxidation-promoting agent layer 120 may be formed as a monolayer on the semiconductor substrate 110. Thus, in some cases, the thickness of the oxidation-promoting composition layer may be as small as possible.

The oxidation-promoting composition according to embodiments of the invention has been described above, and thus, will not be discussed further. However, in some embodiments, the oxidation-promoting composition applied to the semiconductor substrate 110 may include the oxidation-promoting agent represented by Formula 1. To uniformly chemisorb the oxidation-promoting agent to a surface of the semiconductor substrate 110, aging may be necessary. Accordingly, in some embodiments, to chemisorb the oxidation-promoting agent on a surface of the semiconductor substrate 110 to form a monolayer including the oxidation-promoting agent, the oxidation-promoting composition may be aged on the surface of the semiconductor substrate 110, for example, for a time in a range of about 5 seconds to about 1 minute.

Figure 1B:
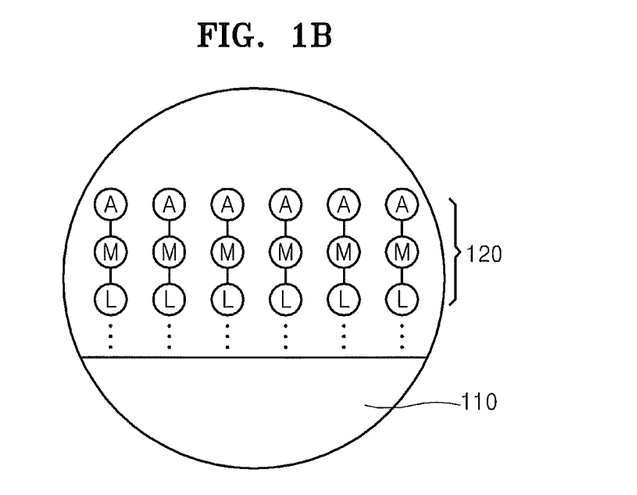

Then, in some embodiments, the excess oxidation-promoting composition may be rinsed off by using a solvent. In some cases, excess oxidation-promoting composition may agglomerate together and act as an impurity. As such, in some cases, it may be necessary to remove the excess oxidation-promoting composition by a process such as rinsing. In some embodiments, the rinsing solvent may be the same solvent that is included in the oxidation-promoting composition, or in some cases, it may be solvent that has similar properties to the solvent that is included in the oxidation-promoting composition. For example, the solvents may be similar in terms of polarity, molecular weight, or intermolecular attraction. An oxidation-promoting agent layer 120 as illustrated in FIG. 1A may be present after the rinsing step. FIG. 1B is an enlarged view of the 1B circle illustrated in FIG. 1A.

Referring to FIG. 1B, in some embodiments, the oxidation-promoting agent layer 120 may be formed as a monolayer on the semiconductor substrate 110. In Formula 1, the L moiety may be chemisorbed to the surface of the semiconductor substrate 110. In FIG. 1B, the chemisorption is indicated by a dotted line.

The oxidation-promoting agent may be uniformly or non-uniformly distributed on the surface of the semiconductor substrate 110. Regardless of the uniform or non-uniform distribution of the oxidation-promoting agent on the surface of the semiconductor substrate 110, in some embodiments, the resulting oxide layer may have higher density and higher quality than an oxide layer that is formed using a conventional oxide layer formation method, although the magnitude of the effect of the oxidation-promoting agent may vary.

Figure 2:
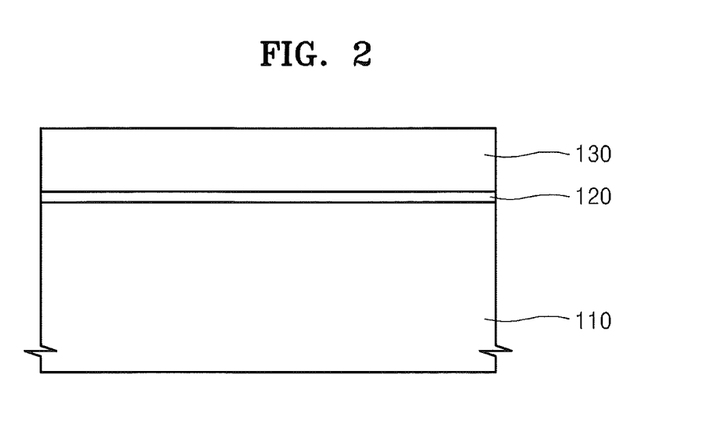

Referring to FIG. 2, after the oxidation-promoting agent layer 120 is formed, an SOG material layer 130 may be formed thereon. Any suitable SOG material layer may be used, and in some cases, other oxide forming materials may be used. However, in some cases, the SOG material layer 130 may include a polysilazane compound, such as perhydropolysilazane (PHPS). In some embodiments, the polysilazane may be represented by —$(SiH_2NH_2)_n$—, wherein n is a positive integer of 5 or more, and opposite ends thereof may be terminated with, for example, a hydrogen atom. Any suitable method of preparing the polysilazane may be used. However, in some cases, the polysilazine may be prepared by the following method. A halosilane may be reacted with a Lewis base to produce a complex, and then the complex may be reacted with ammonia. In other words, a halosilane, such as $SiCl_4$, or $SiH_2Cl_2$, may be reacted with a Lewis base, such as amine, to produce a silazane in a form of a complex compound and the silazane may be polymerized into a polysilazane by using an alkali metal halide catalyst or a transition metal complex catalyst.

In some embodiments, to form the SOG material layer 130, an SOG composition that includes a solvent and a polysilazane compound is applied on the oxidation-promoting agent layer 120. The applying of the SOG composition may be performed by, for example, spin coating or dip coating. However, any suitable application method may be used. The application thickness of the SOG composition may be determined in consideration of a desired thickness of the silicon oxide layer to be formed.

In some embodiments, the concentration of the polysilazane compound in the SOG composition is in a range of about 5 wt. % to about 30 wt. %, and the concentration of the solvent is in a range of about 70 wt. % to about 95 wt. %. The polysilazane may have any suitable molecule weight, but in some embodiments, the polysilazane compound has a weight average molecular weight in a range of about 1,000 to about 8,000 daltons.

Any suitable solvent may be used in the SOG composition. However, examples of suitable solvents include toluene, benzene, xylene, dibutyl ether, dimethyl ether, diethyl ether, tetrahydrofuran, propylene glycol methoxy ether (PGME), propylene glycol ether monomethyl ether acetate (PGMEA) and hexane. Solvent may be removed from the SOG composition by soft baking the composition. In some embodiments, the SOG composition is soft baked at a temperature in a range of about 100° C. to about 250° C. In some embodiments, the SOG composition is soft baked for a time in a range of about 10 minutes to about 1 hour. Through the soft baking, most of the solvent may be removed from the SOG composition.

In some embodiments, the soft baking may be followed by a hard baking step. In some embodiments, hard baking may be performed at a temperature in a range of about 300° C. to about 600° C., and in some embodiments, hard baking may be performed for a time in a range of about 10 minutes to about 1 hour. Through the hard baking, the solvent may be almost completely removed from the SOG composition. In some embodiments, no hard baking step is necessary, and the SOG material layer 130 may be formed by soft baking alone.

Figure 3A:
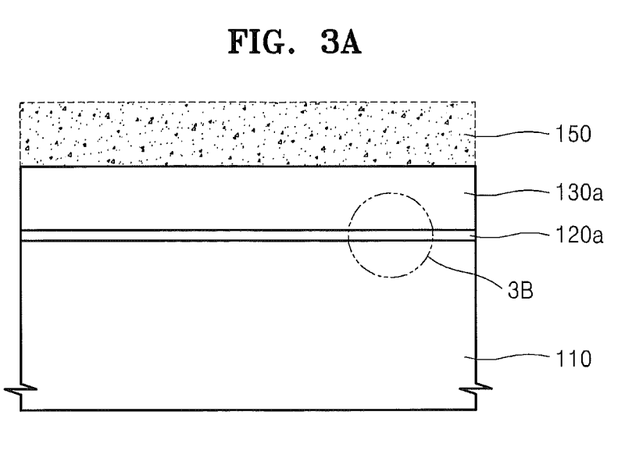

Referring to FIG. 3A, in some embodiments, the SOG material layer 130 may be annealed in an oxidizing atmosphere 150. In some cases, the annealing is performed at a temperature in a range of about 650° C. to about 1200° C. In some embodiments, the SOG material layer 130 is annealed for a time in a range of about 20 minutes to about 2 hours.

Figure 3B:
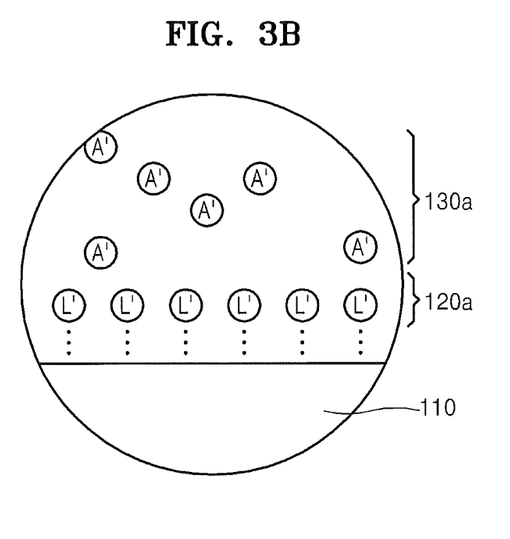

FIG. 3B is an enlarged view of the 3B circle illustrated in FIG. 3A. Referring to FIG. 3B, the M moiety from Formula 1, as illustrated in FIG. 1B, may be thermally decomposed, and thus, the oxidation-promoting agent layer 120 may be divided into a first portion L' adsorbed to the semiconductor substrate 110 and a second portion A' diffusing into the SOG material layer 130a.

The location of the thermal decomposition of the M moiety may vary according to the chemical structure thereof. If a bond in the M moiety is decomposed and thus the M moiety is divided into two portions, among the separate two portions, a portion of the M moiety that is adjacent to the A moiety may remain attached to the A moiety to become the A' illustrated in FIG. 3B. Similarly, the portion of the M moiety that is adjacent to the L moiety may remain attached to the L moiety to form a second portion L' illustrated in FIG. 3B. If the thermal decomposition location is a bond that links the A moiety with the M moiety, the A moiety forms the first portion A' moiety illustrated in FIG. 3B, and the M moiety and the L moiety form the L' moiety illustrated in FIG. 3B. Similarly, if the thermal decomposition location is a bond that links the L moiety to the M moiety, the A moiety and the M moiety form the A' moiety illustrated in FIG. 3B, and the L moiety forms the L' moiety illustrated in FIG. 3B.

As a result of the thermal decomposition of M, only the L' moiety may remain in the layer 120a, while the A' moiety may diffuse into the SOG material layer 130a. In some cases, the concentration of the diffused A' moiety in the SOG material layer 130a may be higher in the portion of the SOG material layer 130a that is adjacent to layer 120a, and the concentration of the diffused A' moiety may be lower near the surface of the SOG material layer 130a that is exposed to the oxidizing atmosphere 150.

If the A' moiety is not diffused into the SOG material layer, the portion of the SOG material layer 130a adjacent to the layer 120a may not be sufficiently oxidized due to its distance from the oxidizing atmosphere 150. However, as illustrated in FIG. 3B, since the A' moiety diffuses into the portion of the SOG material layer 130a adjacent to the layer 120a, the A' moiety may contribute to oxidation of an SOG material that is adjacent to the layer 120a, which may enable formation of silicon oxide at a relatively low temperature.

This concept will now be described in more detail with reference to FIG. 3C, which illustrates a concentration profile of oxidants in the SOG material layer 130a during annealing.

Figure 3C:
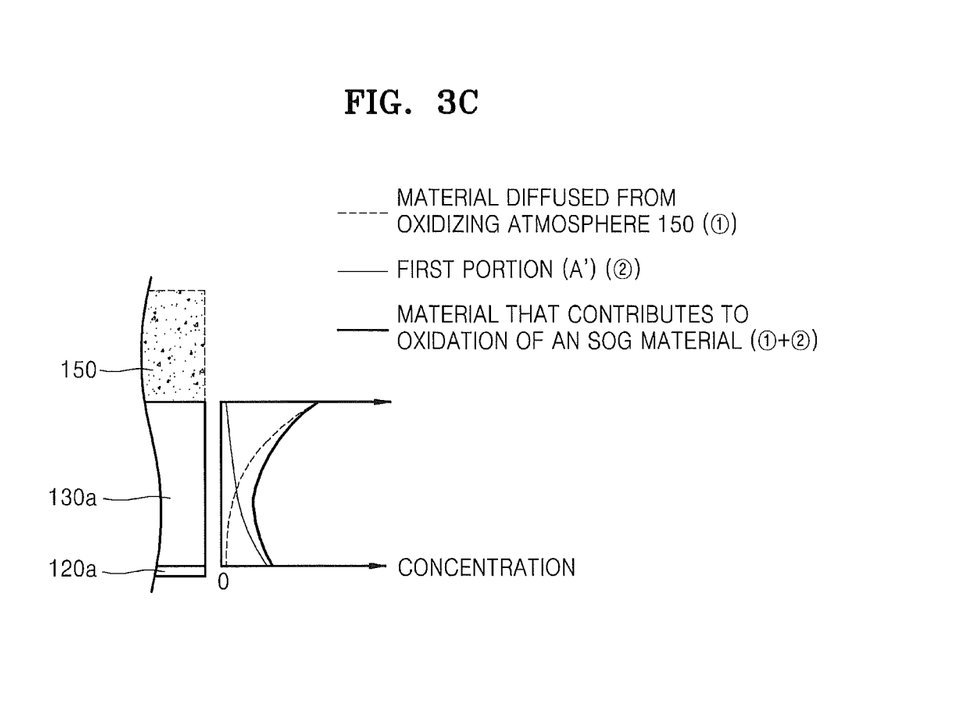

Referring to FIG. 3C, the concentration of an oxidant that is diffused from the oxidizing atmosphere 150, indicated by ①, is highest at the interface between the SOG material layer 130a and the oxidizing atmosphere 150, and decreases toward the layer 120a. The concentration of the A' moiety, indicated by ②, is highest at the interface between the SOG material layer 130a and the layer 120a, and decreases with distance from that interface.

The diffused A' moiety and the oxidant diffused from the oxidizing atmosphere 150 both contribute to oxidation of the SOG material, for example, a polysilazane included in the SOG material layer 130a. Accordingly, the sum of the contributions from the oxidizing atmosphere 150 and the diffused A' moiety creates the concentration profile (①+②) of the all oxidants in the SOG material layer 130a. This concentration profile is indicated by the thick line illustrated in FIG. 3C.

Figure 4:
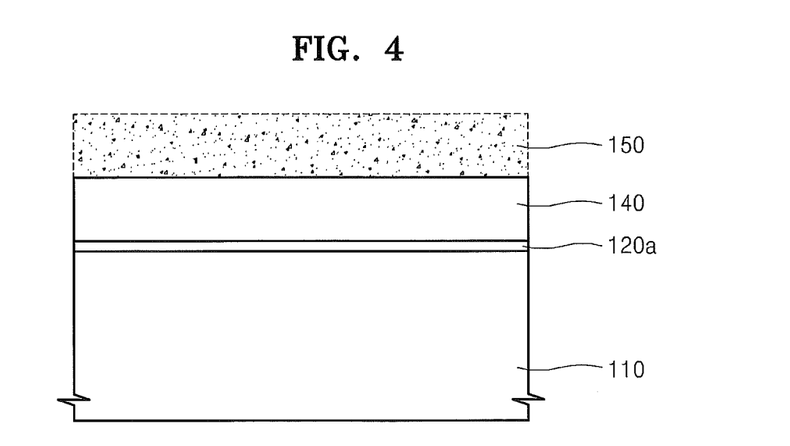

If the diffused A' moiety is not present, that is, if the oxidation of the SOG material layer 130a is performed using only the oxidant from the oxidizing atmosphere 150, a high temperature annealing or long-term annealing may be required to oxidize the portion of the SOG material layer 130a that is furthest from the oxidization atmosphere 150. However, due to the diffusion of the A' moiety in the instant process, the concentration of oxidant in the SOG material is considerably increased, and thus, the annealing temperature and time, which are required to oxidize the SOG material layer 130a, may also be considerably decreased. In addition, a high conversion of the SOG material layer 130a into a silicon oxide can be obtained, and thus, the densification of all or substantially all of the silicon oxide layer may be achieved. Referring to FIG. 4, the SOG material layer 130a may be completely oxidized to form dense silicon oxide layer 140.

According to some embodiments of the invention, provided are methods of fabricating semiconductor devices. FIGS. 5A to 5J are cross-sectional views illustrating a method of fabricating a semiconductor device according to some embodiments of the present invention.

Figure 5A:
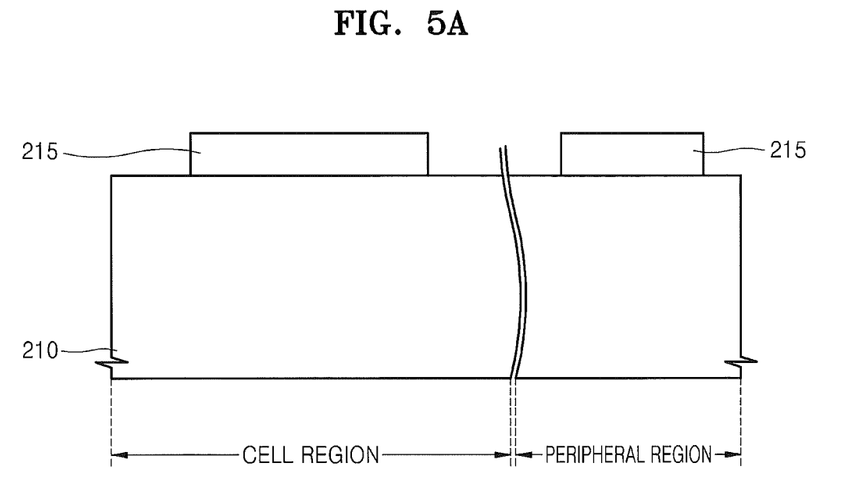
FIGS. 5A to 5J are cross-sectional views illustrating a method of fabricating a semiconductor device, according to some embodiments of the present invention.

Referring to FIG. 5A, a semiconductor substrate 210 may be prepared, and an etch mask 215 may be formed on the semiconductor substrate 210 to define an active region in the semiconductor substrate 210. The etch mask 215 may be a photoresist layer or a hard mask, such as a silicon nitride layer. If the etch mask 215 is a hard mask, a silicon nitride layer may be formed and then, the etch mask 215, as a hard mask, may be formed by photolithography. Also, if desired, the method may further include forming a pad oxide layer (not shown) before the etch mask 215 is formed.

Figure 5B:
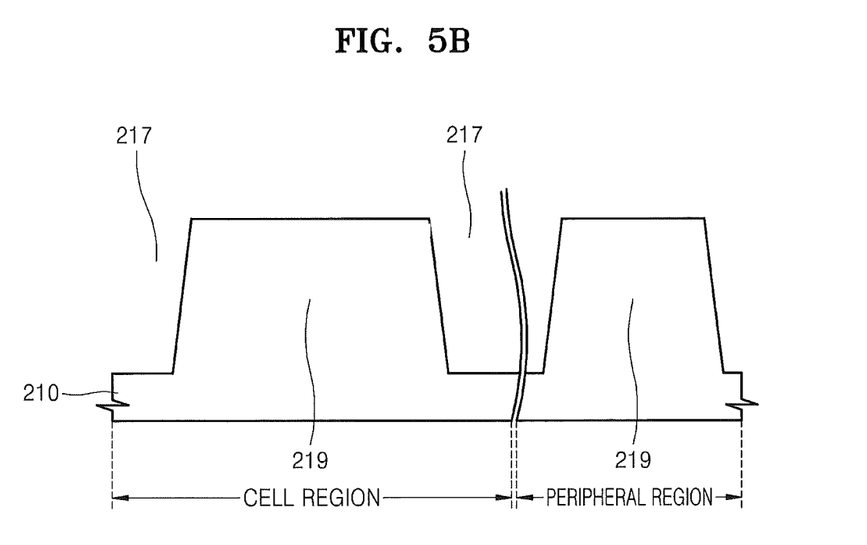

Referring to FIG. 5B, anisotropic etching may then be performed on the etch mask 215 to form a trench 217. The anisotropic etching may be, for example, plasma etching, but is not limited thereto. Due to the formation of the trench 217, active regions 219 may be defined. Then, if desired, the etch mask 215 may be removed by dry etching or wet etching.

Figure 5C:
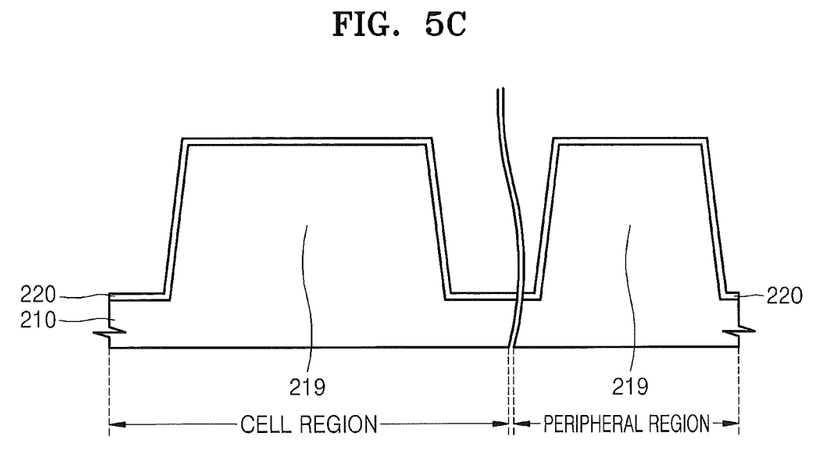

Referring to FIG. 5C, an oxidation-promoting agent layer 220 may then be formed on the surface of the semiconductor substrate 210. To form the oxidation-promoting agent layer 220, an oxidation-promoting composition layer is formed by, for example, spin coating, and then, the oxidation-promoting composition layer is rinsed. Methods and compositions for forming oxidation-promoting agent layers 220 have been described above in detail, and thus, will not be described further. The oxidation-promoting agent layer 220 may be formed as a monolayer by chemisorption, as described above, and so the oxidation-promoting agent layer 220 may conform to the semiconductor substrate 210.

Figure 5D:
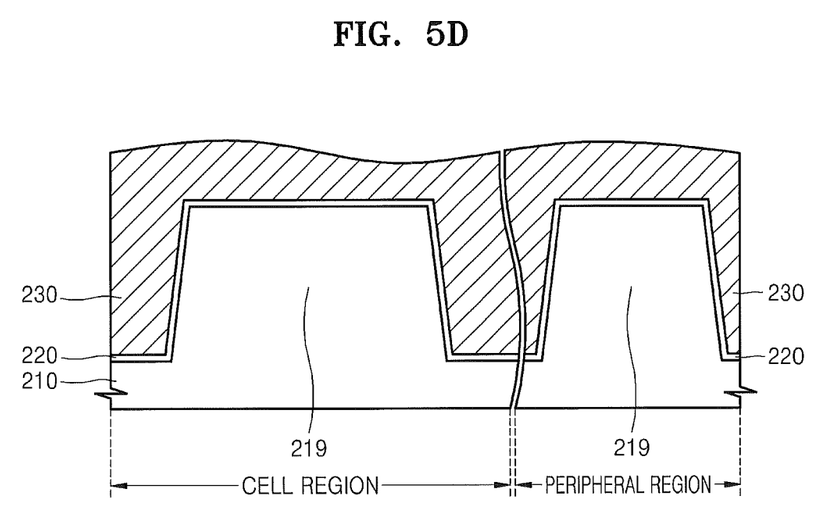

Referring to FIG. 5D, an SOG material layer 230 may be formed on the oxidation-promoting agent layer 220. As described above, the SOG material layer 230 may include, for example, polysilazane dissolved in a solvent.

Figure 5E:
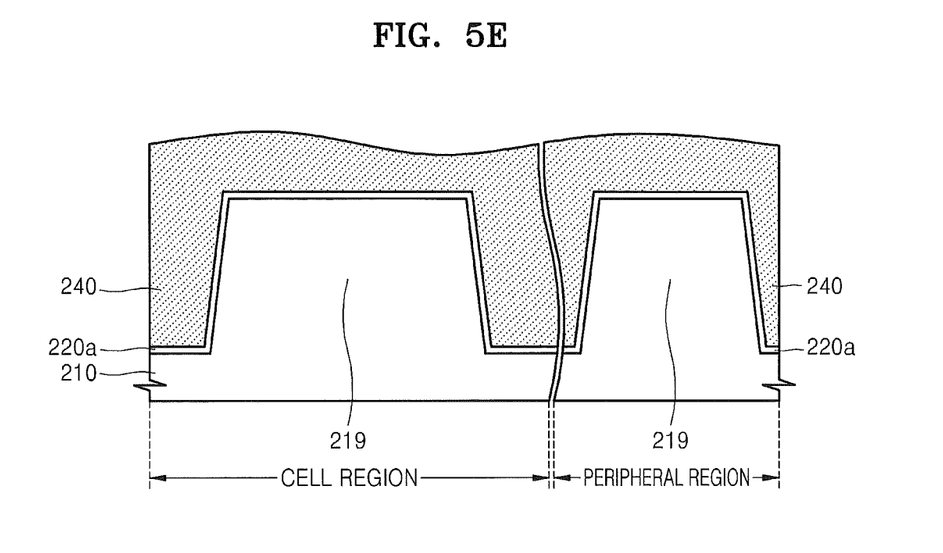

Referring to FIG. 5E, soft baking may be performed on the SOG material layer 230. Additionally, if desired, hard baking may be further performed on the SOG material layer 230. Process conditions for the soft baking and the hard baking have been described above, and thus, will not be discussed further. Next, the SOG material layer 230 may be annealed in an oxidizing atmosphere to form silicon oxide layer 240.

Annealing conditions for the SOG material layer 230 and the effect of the annealing on the oxidation-promoting agent layer 220 have been described above, and thus, will not be discussed further. It may be noted, however, that due to the annealing, the portion of the oxidation-promoting agent layer 220 on the oxidative A moiety side is separated as the A' moiety, and the residual portion (L') forms a layer 220a illustrated in FIG. 5E. Thus, the layer 220a may be different from the oxidation-promoting agent layer 220 illustrated in FIG. 5D.

Figure 5F:
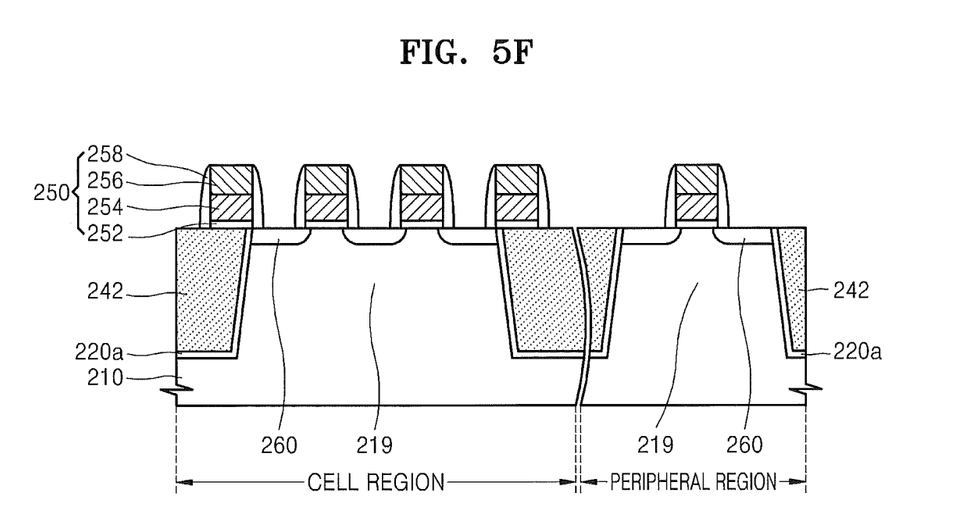

Referring to FIG. 5F, an upper portion of the silicon oxide layer 240 may be removed to expose an upper surface of the active region 219, thereby forming a device isolation layer 242. In other words, the upper surface of the silicon oxide layer 240 may be removed, for example, by chemical mechanical polishing or wet or dry etch-back etching, to expose an upper surface of the active region 219 and to form the device isolation layer 242.

Then, a gate dielectric material layer, a conductive layer and a capping material layer (not shown) may be sequentially deposited on surfaces of the semiconductor substrate 210 and the device isolation layer 242 and then subjected to photolithography to form a gate dielectric 252, a gate electrode 254, and a capping layer 256, respectively. Next, a material layer including silicon nitride may be conformally applied thereon and anisotropic etching may be performed thereon to form a spacer 258, thereby completing the manufacture of a gate structure 250. Then, high concentrations of ions may be implanted using the gate structure 250 as an ion implantation mask to form a source/drain region 260.

Figure 5G:
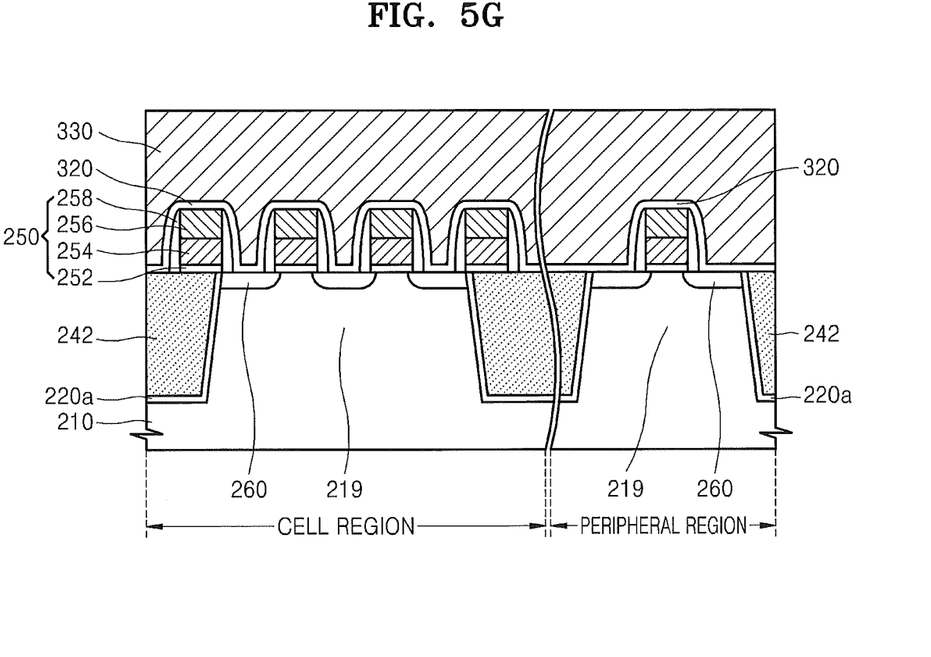

Referring to FIG. 5G, an oxidation-promoting agent layer 320 may be conformally formed on the gate structure 250, an exposed portion of the semiconductor substrate 210, and an exposed portion of the device isolation layer 242, and an SOG material layer 330 may be formed on the oxidation-promoting agent layer 320. The methods of forming the oxidation-promoting agent layer 320 and the SOG material layer 330 have been described above, and thus, will not be discussed further.

Figure 5H:
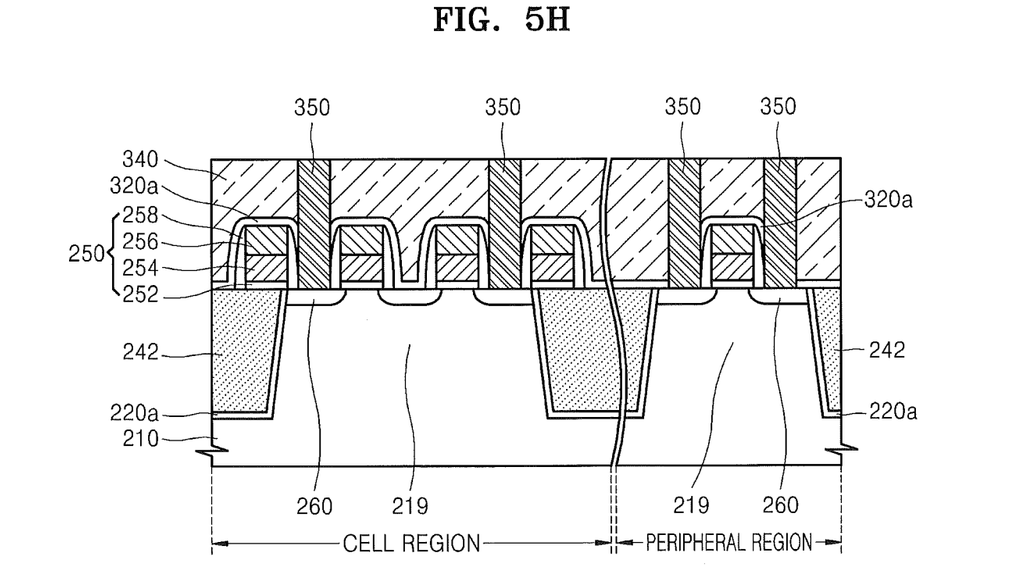

Referring to FIG. 5H, soft baking may be performed on the SOG material layer 330. Then, if desired, hard baking may be further performed on the SOG material layer 330. Next, the SOG material layer 330 may be annealed in an oxidizing atmosphere to form a silicon oxide layer 340. The soft baking, the hard baking, and the annealing have been described above, and thus, will not be discussed further.

As with the formation of the device isolation layer 242, due to the annealing, the A portion of the compound of Formula 1 may be separated as the A' moiety. Thus, the residual portion (L') may form the layer 320a illustrated in FIG. 5H, and the layer 320a may be different from the oxidation-promoting agent layer 320 illustrated in FIG. 5G.

Next, a pad electrode 350 for connecting the source/drain region 260 to, for example, an interconnection line, may be formed. To form the pad electrode 350, a via-hole may be formed, for example, by photolithography, and then the via-hole may be filled with a conductive material. A node separation may then be performed thereon, for example, by chemical mechanical polishing (CMP).

Figure 5I:
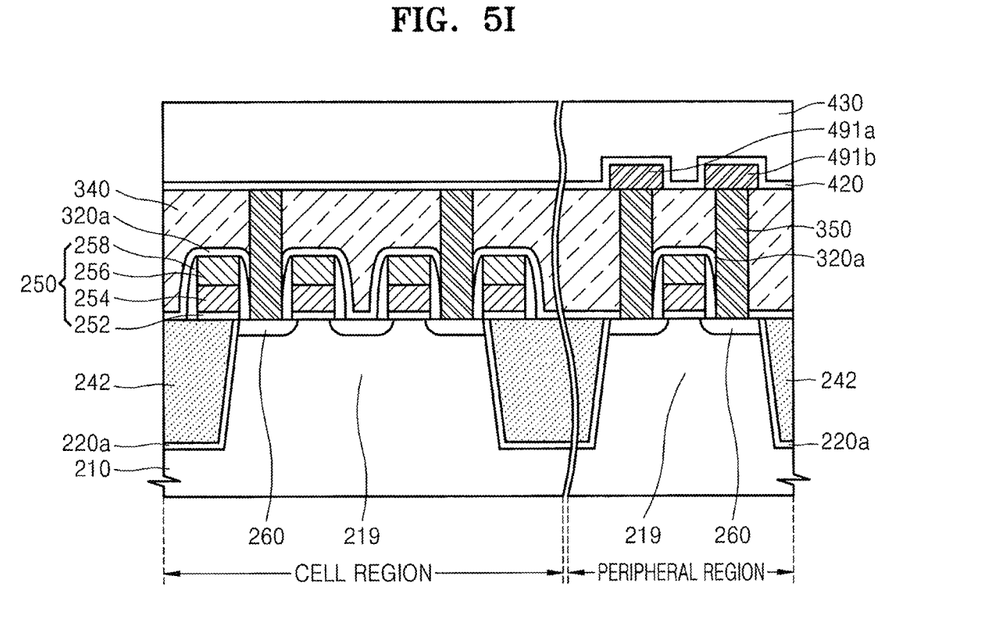

Referring to FIG. 5I, an interconnection line 491a or pad 491b, which is electrically connected to the pad electrode 350, may be formed. The interconnection line 491a may extend in the direction of sight for connection with an electrode. Also, the pad 491b may also be used for electrical connection with other interconnection lines or capacitors on the upper portion of the silicon oxide layer 340.

Next, an oxidation promoting layer 420 and an SOG material layer 430 may be formed on the silicon oxide layer 340, the interconnection line 491a, and the pad 491b. The methods of fanning the oxidation promoting layer 420 and the SOG material layer 430 have been described above, and thus, will not be discussed further. Before the oxidation promoting layer 420 and the SOG material layer 430 are formed, a bit line (not shown) that is connected to a pad electrode (not shown) in a drain region of each of the transistors in a cell region may be formed. In this case, the bit line may be covered by the oxidation promoting layer 420 and the SOG material layer 430.

Figure 5J:
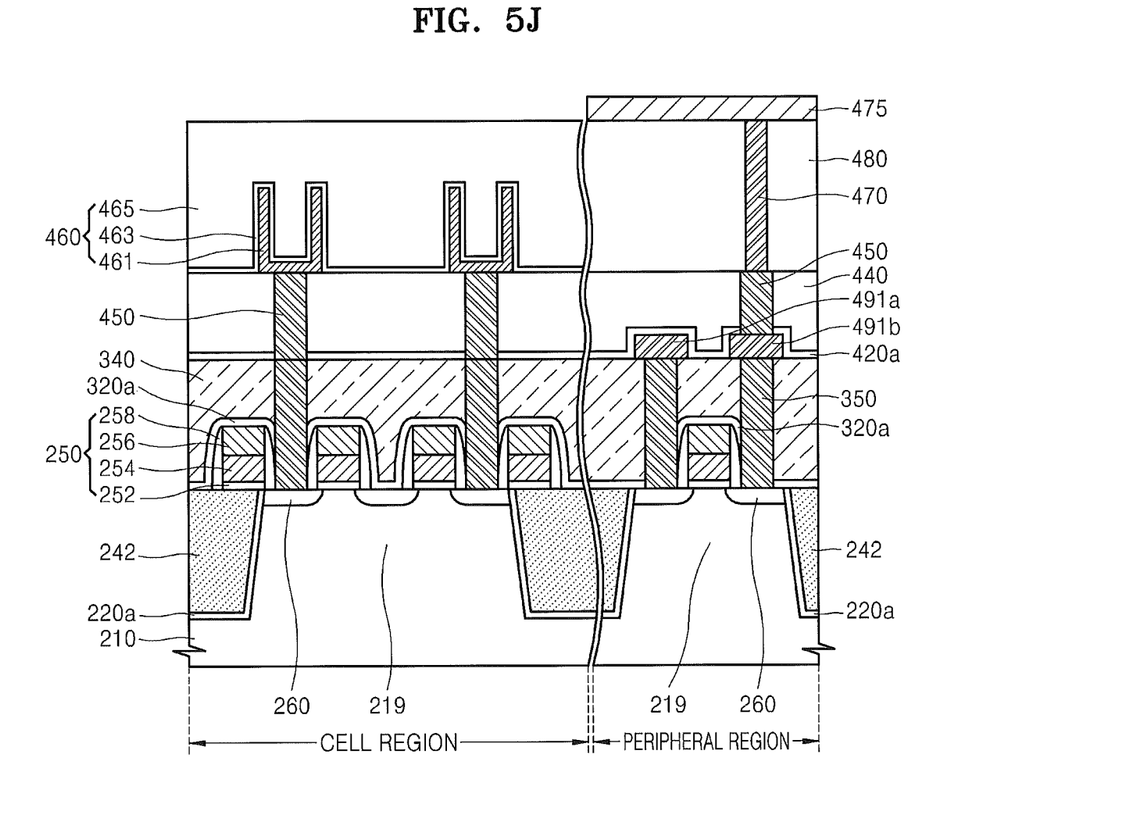

Referring to FIG. 5J, as described with reference to FIG. 5H, soft baking and annealing may be performed thereon to form a silicon oxide layer 440. Due to the annealing, as described with reference to FIG. 5H, the layer 420a may be distinguished from the oxidation promoting layer 420.

The silicon oxide layer 440 may act as an interlayer dielectric, and in particular, as illustrated in FIG. 5J, the silicon oxide layer 440 may support a capacitor 460 connected with a contact plug 450. To form the contact plug 450, a via-hole may be formed in the silicon oxide layer 440 and then filled with a conductive material. In a cell region, a lower electrode 461, a dielectric 463, and an upper electrode 465 may be formed on the contact plug 450 to form a capacitor 460. Also, in a peripheral region, dielectric 480 may be additionally formed on the silicon oxide layer 440 and then contact plug 470 may be formed therein for connection with the interconnection line 475 disposed on the contact plug 470.

As described with reference to FIGS. 5A to 5J, the oxidation-promoting composition may be used to form the device isolation layer 242, the silicon oxide layer 340 and 440, and the dielectric 480. Due to the use of the oxidation-promoting composition, a dense and high quality oxide layer may be obtained. Additionally, in some embodiments, the processes described herein may provide higher conversion rates at lower temperatures than can be obtained by conventional methods.

Hereinafter, the structure and effect of the inventive concept will be described in detail with reference to Examples and Comparative Examples. However, Examples are used for illustrative purpose only and do not limit the scope of the invention.

EXAMPLES

Example 1

An oxidation-promoting composition including 99.8 weight (wt) % of a dimethyl ether solvent and 0.2 wt. % of an oxidation-promoting agent represented by Formula 2 below was spin coated on an 8-inch silicon wafer surface, and then aged for 30 seconds. In Formula 2, —Si(OCH$_3$)$_3$ moiety corresponds to the L moiety of Formula 1, —(CH$_2$)$_7$— moiety corresponds to the M moiety of Formula 1, and —C$_5$NH$_4$ moiety corresponds to the A moiety of Formula 1.

(2)

Then, the silicon wafer surface was rinsed with dimethyl ether to remove excess oxidation-promoting agent, thereby completing formation of the oxidation-promoting agent layer.

Polysilazane was spin coated on the oxidation-promoting agent layer, soft baking was performed thereon at a temperature of 120° C. for 20 minutes, and then hard baking was performed thereon at a temperature of 400° C. for 15 minutes. Then, annealing was performed thereon at a temperature of 900° C. for 1 hour, thereby completing formation of a silicon oxide layer. The annealing was performed in an oxidizing atmosphere. The thickness of the silicon oxide layer was measured at 17 sites of the silicon wafer, and the average oxide layer thickness and standard deviation thereof, was calculated.

Example 2

A silicon oxide layer was formed in the same manner as in Example 1 except that the compound of Formula 3 below was used as the oxidation-promoting agent. The average oxide layer thickness and standard deviation of the silicon oxide layer was also obtained in the same manner as in Example 1.

(3)

Example 3

A silicon oxide layer was formed in the same manner as in Example 1 except that the compound of Formula 4 below was used as the oxidation-promoting agent. The average oxide layer thickness and standard deviation of the silicon oxide layer was also obtained in the same manner as in Example 1.

(4)

Example 4

A silicon oxide layer was formed in the same manner as in Example 1 except that the compound of Formula 5 below was used as the oxidation-promoting agent. The average oxide layer thickness and standard deviation of the silicon oxide layer was also obtained in the same manner as in Example 1.

(5)

Example 5

A silicon oxide layer was formed in the same manner as in Example 1 except that the compound of Formula 6 below was used as the oxidation-promoting agent. The average oxide layer thickness and standard deviation of the silicon oxide layer was also obtained in the same manner as in Example 1.

(6)

Example 6

A silicon oxide layer was formed in the same manner as in Example 1 except that the compound of Formula 7 below was used as the oxidation-promoting agent. The average oxide layer thickness and standard deviation of the silicon oxide layer was also obtained in the same manner as in Example 1.

(7)

Comparative Example 1

A silicon oxide layer was formed in the same manner as in Example 1 except that the oxidation-promoting agent layer was not formed. The average oxide layer thickness and standard deviation of the silicon oxide layer was also obtained in the same manner as in Example 1.

The silicon oxide layers prepared according to Examples 1-6, and Comparative Example 1 were each etched with fluoric acid (HF, 200:1 dilution) for 5 minutes, and the thicknesses of residual silicon oxide layers were measured and average oxide layer thicknesses and standard deviations thereof were obtained. The average thicknesses and standard deviations are shown in Table 1 below

TABLE 1

| | Before etching | | After etching | | Thickness decrease rate (1-②/①) |
|---|---|---|---|---|---|
| | Average thickness ① (nm) | Standard deviation (nm) | Average thickness ② (nm) | Standard deviation (nm) | |
| Comparative Example 1 | 101.5 | 4.7 | 51.2 | 3.6 | 49.6% |
| Example 1 | 99.8 | 4.6 | 58.4 | 3.2 | 41.5% |
| Example 2 | 95.1 | 4.5 | 54.5 | 3.1 | 42.7% |
| Example 3 | 95.5 | 4.6 | 54.7 | 3.1 | 42.7% |
| Example 4 | 98.5 | 4.4 | 57.5 | 3.2 | 41.6% |
| Example 5 | 100.7 | 4.4 | 57.8 | 3.2 | 42.6% |
| Example 6 | 93.1 | 4.4 | 54.7 | 3.0 | 41.2% |

As shown in Table 1, the silicon oxide layer prepared according to Comparative Example 1 showed a thickness decrease rate of about 50%, and the silicon oxide layers prepared according to Examples 1-6 showed a thickness decrease rate of about 40%. Accordingly, the data confirm that the use of the oxidation-promoting agents is effective for densifying the silicon oxide layers. Also, regarding the standard deviations, the silicon oxide layers prepared according to Examples 1-6 showed a decrease in the standard deviation relative to the silicon oxide layer prepared according to Comparative Example 1. Thus, that the use of the oxidation-promoting agents is also effective for decreasing a standard deviation is confirmed.

Example 7

A plurality of trenches each having a depth of 1300 Å were formed in an 8-inch silicon wafer, and then an oxidation-promoting composition including 99.8 wt. % of a dimethyl ether solvent and 0.2 wt. % of an oxidation-promoting agent represented by Formula 2 was spin coated on the silicon wafer and aged for 30 seconds. Then, the silicon wafer surface was rinsed with dimethyl ether to remove excess oxidation-promoting agent, thereby completing formation of an oxidation-promoting agent layer.

Polysilazane was spin coated on the oxidation-promoting agent layer, soft baking was performed thereon at a temperature of 120° C. for 20 minutes, and then hard baking was performed thereon at a temperature of 400° C. for 15 minutes. Then, annealing was performed thereon at a temperature of 900° C. for 1 hour, thereby completing formation of a silicon oxide layer. The annealing was performed in an oxidizing atmosphere.

The thickness of the silicon oxide layer was measured at 12 trenches formed in the silicon wafer, and an average oxide layer thickness thereof was obtained.

Example 8

A silicon oxide layer was formed in the same manner as in Example 7 except that the compound of Formula 3 was used as the oxidation-promoting agent. The average oxide layer thickness of the silicon oxide layer was obtained in the same manner as in Example 7.

Example 9

A silicon oxide layer was formed in the same manner as in Example 7 except that the compound of Formula 4 was used as the oxidation-promoting agent. The average oxide layer thickness of the silicon oxide layer was obtained in the same manner as in Example 7.

Example 10

A silicon oxide layer was formed in the same manner as in Example 7 except that the compound of Formula 5 was used as the oxidation-promoting agent. The average oxide layer thickness of the silicon oxide layer was obtained in the same manner as in Example 7.

Example 11

A silicon oxide layer was formed in the same manner as in Example 7 except that the compound of Formula 6 was used as the oxidation-promoting agent. The average oxide layer thickness of the silicon oxide layer was obtained in the same manner as in Example 7.

Example 12

A silicon oxide layer was formed in the same manner as in Example 7 except that a the compound of Formula 7 was used as the oxidation-promoting agent. The average oxide layer thickness of the silicon oxide layer was obtained in the same manner as in Example 7.

Comparative Example 2

A silicon oxide layer was formed in the same manner as in Example 7 except that the oxidation-promoting agent layer was not formed. The average oxide layer thickness of the silicon oxide layer was obtained in the same manner as in Example 7.

The silicon oxide layers prepared according to Examples 7-12 and Comparative Example 2 were each etched with fluoric acid (HF, 200:1 dilution) for 5 minutes, and thicknesses of residual silicon oxide layers were measured and average oxide layer thicknesses thereof were measured.

The average thicknesses are shown in Table 2 below.

TABLE 2

|  | Average thickness ③ before etching (nm) | Average thickness ④ after etching (nm) | Thickness decrease rate (1-④/③) |
|---|---|---|---|
| Comparative Example 2 | 178.6 | 125.8 | 29.6% |
| Example 7 | 177.5 | 138.8 | 21.8% |
| Example 8 | 181.1 | 139.2 | 23.1% |
| Example 9 | 180.5 | 139.0 | 23.0% |
| Example 10 | 179.8 | 140.4 | 21.9% |
| Example 11 | 181.6 | 139.7 | 23.1% |
| Example 12 | 183.0 | 143.5 | 21.6% |

As shown in Table 2, the silicon oxide layers prepared according to Examples 7-12 showed smaller thickness decrease rates than the silicon oxide layer prepared according to Comparative Example 2. Specifically, the silicon oxide layer prepared according to Comparative Example 2 showed a thickness decrease rate of about 29.6%, and the silicon oxide layers prepared according to Examples 7-12 showed a thickness decrease rate of about 21.6% to about 23.1%. Such results may be due to a denser structure of the silicon oxide layers.

The silicon oxide layers formed by methods described herein may be useful in a number of applications. As an example, the silicon oxide layers described by a method according to an embodiment of the invention may be used as a device isolation layer, a pre-metal dielectric, an interlayer dielectric, an intermetal dielectric, and the like, which may be used in various applications.

While the inventive concept has been particularly shown and described with reference to exemplary embodiments thereof, it will be understood that various changes in form and details may be made therein without departing from the spirit and scope of the following claims.

What is claimed is:

1. A method of forming an oxide layer, the method comprising:
    forming an oxidation-promoting agent layer on a surface of a semiconductor substrate;
    forming a spin-on-glass (SOG) material layer on the oxidation-promoting agent layer;
    soft-baking the SOG material layer; and
    annealing the oxidation-promoting agent layer and the SOG material layer, to form the oxide layer,
    wherein forming the oxidation-promoting agent layer comprises forming a monolayer comprising an oxidation-promoting agent, and
    wherein forming the monolayer comprises:
        applying an oxidation-promoting composition to the surface of the semiconductor substrate,
        wherein the oxidation-promoting composition comprises an oxidation-promoting agent represented by Formula 1:

$$A\text{-}M\text{-}L \quad (1)$$

wherein L is a functional group that is capable of being chemisorbed to a surface of silicon, silicon oxide, silicon nitride or a metal,
   wherein A is an oxidizing functional group, and
   wherein M is a thermally decomposable moiety that allows A and L to be covalently linked.

2. The method of claim 1, wherein M is a $C_2$ to $C_{18}$ hydrocarbon.

3. The method of claim 1, wherein M comprises a hydrazine moiety (—N═N—), a peroxide moiety (—O—O—), or a disulfide moiety (—S—S—).

4. The method of claim 1, wherein the oxidation-promoting composition further comprises a solvent.

5. The method of claim 4, wherein the oxidation-promoting agent is present in the oxidation-promoting composition at a concentration in a range of $1\times10^{-6}$ M to $1\times10^{-2}$ M.

6. The method of claim 4, wherein the method further comprises rinsing excess oxidation-promoting composition from the surface of the semiconductor substrate with the same solvent used in the oxidation-promoting composition.

7. The method of claim 4, wherein an attractive force between the oxidation-promoting agent and the semiconductor substrate is stronger than an attractive force between the oxidation-promoting agent and the solvent.

8. The method of claim 1, further comprising aging the oxidation-promoting composition on the surface of the semiconductor substrate so as to chemisorb the oxidation-promoting agent on the surface of the semiconductor substrate.

9. The method of claim 1, wherein the SOG material layer comprises polysilazane.

10. The method of claim 1, wherein the soft baking is performed at a temperature in a range of 100° C. to 250° C.

11. The method of claim 10, wherein the soft baking is performed for a time in a range of 10 minutes to 1 hour.

12. The method of claim 10, further comprising hard-baking the SOG material layer at a temperature in a range of 300° C. to 600° C.

13. The method of claim 12, wherein the SOG material layer is hard baked for a time in a range of 10 minutes to 1 hour.

14. The method of claim 1, wherein the annealing is performed at a temperature in a range of 650° C. to 1200° C.

15. The method of claim 14, wherein the annealing is performed for a time in a range of 20 minutes to 2 hours.

16. The method of claim 1, wherein annealing is performed in an oxidizing atmosphere.

17. A method of fabricating a semiconductor device, the method comprising:

forming an oxidation-promoting agent layer comprising an oxidation-promoting agent represented by Formula 1 on a surface of a semiconductor substrate;

$$A\text{-}M\text{-}L \qquad (1)$$

wherein L is a functional group that is capable of being chemisorbed to a surface of silicon, silicon oxide, silicon nitride, or metal, A is an oxidizing functional group, and M is a thermally decomposable moiety that allows A and L to be covalently bonded to each other;

forming a spin-on-glass (SOG) material layer on the oxidation-promoting agent layer;

soft-baking the SOG material layer and the oxidation-promoting agent layer; and annealing the oxidation-promoting agent layer and the SOG material layer to form an oxide layer.

18. The method of claim 17, wherein the oxide layer is a device isolation layer or an interlayer dielectric.

19. The method of claim 17, wherein M is a C2 to C18 hydrocarbon.

20. The method of claim 17, wherein M comprises a hydrazine moiety (—N=N—), a peroxide moiety (—O—O—), or a disulfide moiety (—S—S—).

* * * * *